(12) United States Patent
Maeda et al.

(10) Patent No.: US 8,703,863 B2
(45) Date of Patent: Apr. 22, 2014

(54) POLYIMIDE PRECURSOR, POLYIMIDE, AND COATING SOLUTION FOR UNDER LAYER FILM FOR IMAGE FORMATION

(75) Inventors: Shinichi Maeda, Funabashi (JP); Yosuke Iinuma, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 638 days.

(21) Appl. No.: 12/451,069

(22) PCT Filed: Apr. 24, 2008

(86) PCT No.: PCT/JP2008/057959
§ 371 (c)(1),
(2), (4) Date: Oct. 23, 2009

(87) PCT Pub. No.: WO2008/133300
PCT Pub. Date: Nov. 6, 2008

(65) Prior Publication Data
US 2010/0069569 A1 Mar. 18, 2010

(30) Foreign Application Priority Data
Apr. 25, 2007 (JP) ................................ 2007-115435

(51) Int. Cl.
*C08L 33/24* (2006.01)

(52) U.S. Cl.
USPC ............. 524/606; 427/508; 521/82; 525/436; 528/322

(58) Field of Classification Search
USPC ............. 524/606; 528/322; 427/508; 521/82; 525/436
See application file for complete search history.

(56) References Cited

U.S. PATENT DOCUMENTS

| | | | | |
|---|---|---|---|---|
| 3,261,811 | A | * | 7/1966 | Tatum ........................... 525/436 |
| 3,554,969 | A | * | 1/1971 | Long et al. ..................... 528/189 |
| 3,575,914 | A | * | 4/1971 | Long et al. ..................... 524/104 |
| 4,271,288 | A | * | 6/1981 | Woo .............................. 528/353 |
| 4,716,216 | A | | 12/1987 | Takekoshi et al. |
| 5,276,133 | A | * | 1/1994 | Okawa et al. .................. 528/353 |
| 5,552,254 | A | * | 9/1996 | Mychajlowsky et al. .. 430/109.5 |
| 8,044,441 | B2 | * | 10/2011 | Maeda et al. .................. 257/245 |

FOREIGN PATENT DOCUMENTS

| | | |
|---|---|---|
| JP | A 62-84124 | 4/1987 |
| JP | A 8-146431 | 6/1996 |
| JP | A 2000-223270 | 8/2000 |
| JP | A 2004-146478 | 5/2004 |
| JP | A 2004-273851 | 9/2004 |
| JP | A 2006-185898 | 7/2006 |
| WO | WO2006/039824 | * 4/2006 |

OTHER PUBLICATIONS

Ueda et al. (Journal of Polymer Science: Polymer Chemistry, vol. 17, pp. 2459-2468 (1979)).*
Beam et al., "Synthesis of monomers and copolymers from isatoic anhydrides," Journal of Polymer Science, Polymer Chemistry Edition, 1978, vol. 16, No. 10, pp. 2679-2681.
International Search Report issued in corresponding International Application No. PCT/JP2008/057959, mailed Jun. 3, 2008 (with English-language Translation).
Written Opinion of the International Searching Authority issued in corresponding International Application No. PCT/JP2008/057959, mailed Jun. 3, 2008 (with English-language Translation).

* cited by examiner

*Primary Examiner* — Peter D. Mulcahy
*Assistant Examiner* — Henry Hu
(74) *Attorney, Agent, or Firm* — Oliff PLC

(57) ABSTRACT

There is provided a polyimide precursor which can alter the hydrophilicity/hydrophobicity of the surface of a cured film formed readily even by a low level of ultraviolet ray irradiation; and a polyimide produced from the polyimide precursor. The polyimide precursor having a structure represented by the following formula (1):

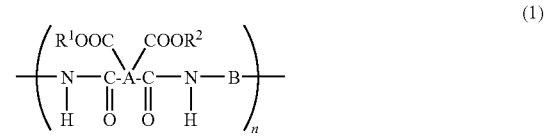

(where A represents a tetravalent organic group; B represents a bivalent organic group having a thiol ester bond in its main chain; $R^1$ and $R^2$ independently represent a hydrogen atom or a univalent organic group; and n represents a natural number).

4 Claims, No Drawings

POLYIMIDE PRECURSOR, POLYIMIDE, AND COATING SOLUTION FOR UNDER LAYER FILM FOR IMAGE FORMATION

TECHNICAL FIELD

The present invention relates to a precursor of polyimide or a polyimide which is produced by dehydrating and ring closing this precursor of polyimide, and moreover, relates to electronic devices produced by using the precursor of polyimide or the polyimide.

BACKGROUND ART

A mask vapor deposition method or an etching method by photolithography is mainly used for the pattern formation of electrodes or functional thin films in the manufacturing process of electronic devices. Problems such as the difficulty of upsizing boards and complicated processes have been indicated in these related-art methods.

Recently, the application of a divisional coating technique utilizing wettability deference of liquids to the patterning of functional thin films has been developed instead of using these related-art methods. This divisional coating technique is a method for producing electronic devices such as an organic electroluminescence (EL) element and an organic field-effect transistor (FET) element by forming a patterning layer including an easy-to-wet region and a difficult-to-wet region on the surface of a substrate, and then applying and drying the solution of a functional thin film forming material on this patterning layer to form a functional thin film only on the easy-to-wet region.

For such a patterning layer for a functional thin film, a layer made by irradiating a photocatalyst-containing layer made of titanium dioxide and organopolysiloxane with ultraviolet light through a mask (for example, refer to Patent Document 1), a layer made by irradiating a layer made of a compound having light-absorbing parts, such as dyes, and fluorine-containing polymer with a laser or with ultraviolet light through a mask (for example, refer to Patent Document 2) are known, for example. In addition, also developed is a method of forming the patterning layer by vapor deposition of a fluorine based coating agent through a mask (for example, refer to Patent Document 3).

Patterning layers developed to date, such as layers described in the Patent Documents, remain in the element even after the patterning of functional thin films is completed. Therefore, this patterning layer needs to have durability to subsequent processes and reliability of not providing adverse effects to the properties of an electronic device when the patterning layer is in the electronic device. Such required properties of the patterning layer vary depending on devices manufactured or the place to use the patterning layer. Among them, an electrical insulation property is the important required property to the patterning layer of an electrode.

Techniques developed to date have only focused on properties as a patterning layer. Therefore, for example, when a source electrode and a drain electrode of an organic FET element are patterned, a gate insulating film needs to be separately prepared under the patterning layer.

By contrast, polyimides have excellent heat resistance, mechanical strength, electrical insulation properties, chemical resistance and the like. Therefore, polyimides are used for various electronic devices. For an example of using a polyimide for a patterning layer, a layer using a tetracarboxylic acid anhydride having an aliphatic ring structure (for example, Patent Document 4) has been disclosed. However, long time exposure treatment is necessary for these examples because these materials require extremely large amounts of ultraviolet ray irradiation.

Patent Document 1: Japanese Patent Application Publication No. JP-A-2000-223270
Patent Document 2: Japanese Patent Application Publication No. JP-A-2004-146478
Patent Document 3: Japanese Patent Application Publication No. JP-A-2004-273851
Patent Document 4: Japanese Patent Application Publication No. JP-A-2006-185898

DISCLOSURE OF THE INVENTION

Problem to be Solved by the Invention

In order to solve the problems described above, it is an object of the present invention to provide a polyimide precursor which can alter the hydrophilicity/hydrophobicity of the surface of a cured film formed readily even by a low level of ultraviolet ray irradiation; and a polyimide produced from the polyimide precursor.

Means for Solving the Problem

As a result of an intensive investigation for achieving the above-described object, the present inventors have discovered that a contact angle to water is significantly altered with a small exposure amount when a polyimide precursor or a polyimide produced from the polyimide precursor having a thiol ester structure in its main chain is used, and have accomplished the present invention.

Namely, according to a first aspect, the present invention relates to a polyimide precursor having a structure represented by the following formula (1):

[Chemical Formula 1]

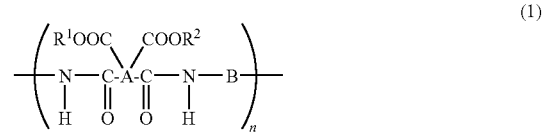

(where A represents a tetravalent organic group; B represents a bivalent organic group having a thiol ester bond in its main chain; $R^1$ and $R^2$ independently represent a hydrogen atom or a univalent organic group; and n represents a natural number).

According to a second aspect, the present invention relates to the polyimide precursor according to the first aspect, in which A in the formula (1) represents a tetravalent organic group having an aliphatic ring or made of only an aliphatic group.

According to a third aspect, the present invention relates to the polyimide precursor according to the first or the second aspect, in which B in the formula (1) represents a bivalent organic group represented by the following formula (2):

[Chemical Formula 2]

(where X and Y independently represent an aromatic ring or an aliphatic ring, and these rings may be substituted by a halogen atom or an alkyl group having 1 to 4 carbon atom(s)).

According to a fourth aspect, the present invention relates to the polyimide precursor according to any one of the first to the third aspects, in which the polyimide precursor is produced by polymerizing at least one type of tetracarboxylic acid dianhydride represented by the following formula (3) and a derivative thereof and at least one type of a diamine represented by the following formula (4):

[Chemical Formula 3]

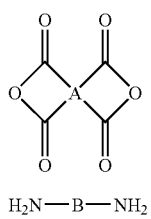

(3)

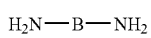

(4)

(where A represents a tetravalent organic group and B represents a bivalent organic group having a thiol ester bond).

According to a fifth aspect, the present invention relates to a polyimide which is produced by dehydrating and ring closing the polyimide precursor as described in any one of the first to the fourth aspects, According to a sixth aspect, the present invention relates to a coating solution for an under layer film for image formation including at least one type of a compound selected from a group consisting of the polyimide precursor as described in any one of the first to the fourth aspects and the polyimide as described in the fifth aspect.

According to a seventh aspect, the present invention relates to a cured film produced by curing the coating solution for an under layer film for image formation as described in the sixth aspect.

According to an eighth aspect, the present invention relates to an under layer film for image formation produced by using the coating solution for an under layer film for image formation as described in the sixth aspect.

According to a ninth aspect, the present invention relates to an under layer film for electrode pattern formation produced by using the coating solution for an under layer film for image formation as described in the sixth aspect.

According to a tenth aspect, the present invention relates to a gate insulating film produced by using the coating solution for an under layer film for image formation as described in the sixth aspect.

According to an eleventh aspect, the present invention relates to a method for forming an under layer film for image formation including: applying the coating solution for an under layer film for image formation as described in the sixth aspect on a substrate, thermosetting it, and irradiating it with an ultraviolet ray.

Effects of the Invention

A coating solution containing at least one type selected from a group consisting of a polyimide precursor and a polyimide produced from the polyimide precursor according to the present invention can alter the surface of a film formed from the solution from hydrophobicity to hydrophilicity by a low level of ultraviolet ray irradiation. Accordingly, an under layer film which is capable of image formation for functional materials such as electrodes or the like can be formed by utilizing these properties. A low level of ultraviolet ray irradiation can alter the property of the surface of the film formed by the coating solution according to the present invention. As a result, this solution is a highly valuable material with respect to productivity, because significant reduction in process time in the manufacture of electronic devices can be achieved.

BEST MODES FOR CARRYING OUT THE INVENTION

The present invention provides a polyimide precursor having a novel structure, a polyimide produced from the polyimide precursor, and a coating solution for an under layer film for image formation containing at least one type of a compound selected from a group consisting of the polyimide precursor and the polyimide. In addition, the present invention relates to a cured film produced from the coating solution and an electronic device using the cured film.

Details will be described below.

(Polyimide Precursor)

The present invention provides a polyimide precursor having a structure represented by the following formula (1):

[Chemical Formula 4]

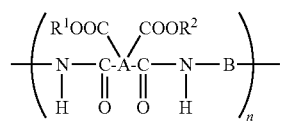

(1)

(where A represents a tetravalent organic group; B represents a bivalent organic group having a thiol ester bond; $R^1$ and $R^2$ independently represent a hydrogen atom or a univalent organic group; and n represents a natural number).

In the formula (1), the structure of an organic group represented by A is not particularly limited, as long as the organic group is a tetravalent organic group. In addition, the structure of the organic group represented by A in the polyimide precursor represented by the formula (1) may be one type or a combination of a plurality of types. Among them, A is preferably a tetravalent organic group having an aliphatic ring or made of only an aliphatic group. More preferably, A is a tetravalent organic group having an aliphatic ring.

Preferable specific examples of the organic group represented by A include organic groups of the following formulae A-1 to A-46.

TABLE 1

(Table 1 Formulae A-1 to A-24)

A-1

A-2

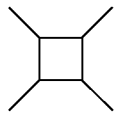

A-3

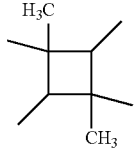

TABLE 1-continued
(Table 1 Formulae A-1 to A-24)
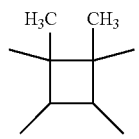
A-4
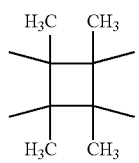
A-5
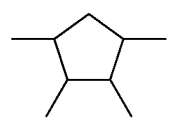
A-6
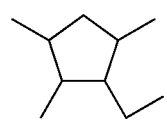
A-7
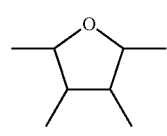
A-8
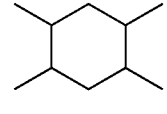
A-9
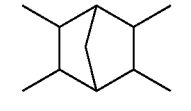
A-10
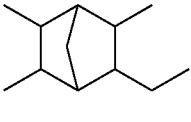
A-11
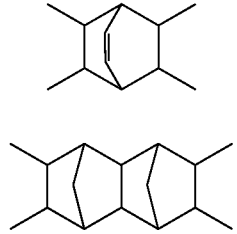
A-12
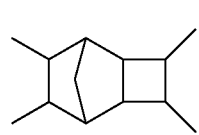
A-13
TABLE 1-continued
(Table 1 Formulae A-1 to A-24)
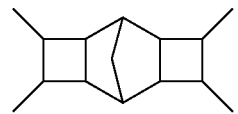
A-14
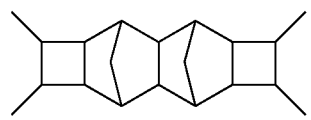
A-15
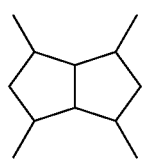
A-16
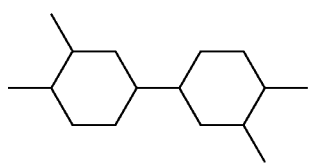
A-17
A-18
A-19
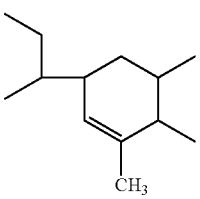
A-20
A-21

TABLE 1-continued
(Table 1 Formulae A-1 to A-24)
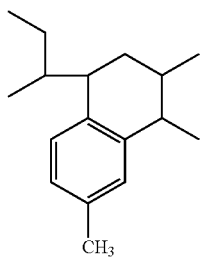 [SMILES: CCC(C)C1CC(C)C(C)c2cc(C)ccc21]
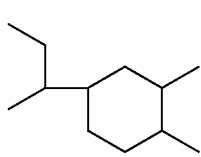
A-22
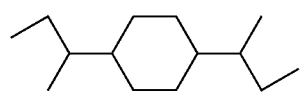
A-23
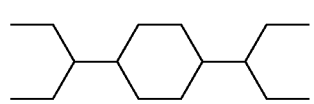 [SMILES: CCC(CC)C1CCC(C(CC)CC)CC1]
A-24
TABLE 2
(Table 2 Formula A-25)
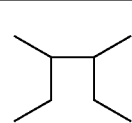
A-25
TABLE 3
(Table 3 Formulae A-26 to A-36)
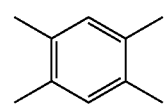
A-26
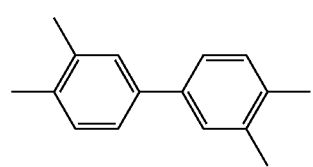
A-27
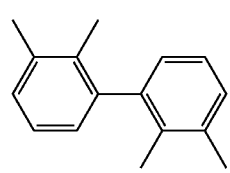
A-28
TABLE 3-continued
(Table 3 Formulae A-26 to A-36)
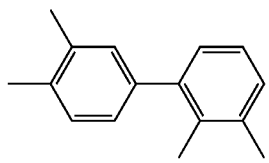
A-29
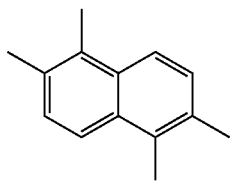
A-30
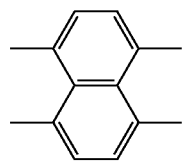
A-31
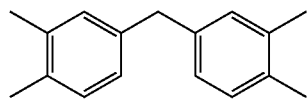
A-32
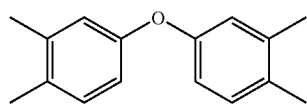
A-33
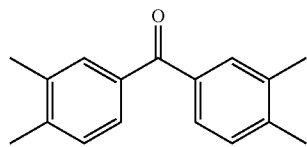
A-34
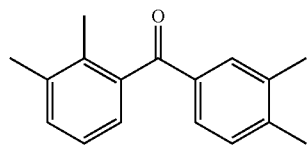
A-35
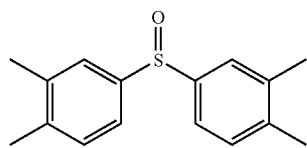
A-36

TABLE 4

(Table 4 Formulae A-37 to A-46)

A-37
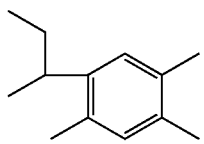

A-38
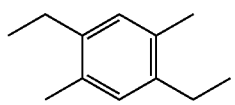

A-39
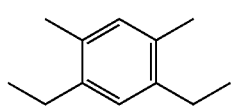

A-40
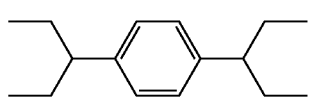 [SMILES: CCC(CC)c1ccc(C(CC)CC)cc1]

A-41
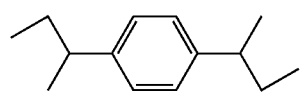

A-42
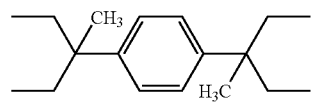

A-43
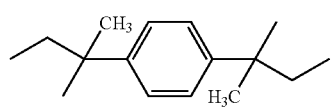 [SMILES: CCC(C)(C)c1ccc(C(C)(C)CC)cc1]

A-44
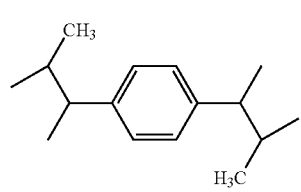

A-45
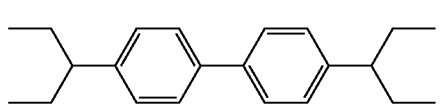

A-46
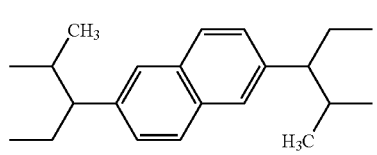 [SMILES: CCC(c1ccc2cc(C(CC)C(C)C)ccc2c1)C(C)C]

The formulae A-1 to A-46 can be selected based on required properties when an under layer film for image formation is made.

For example, in the formulae A-1 to A-46, tetravalent organic groups that improve exposure sensitivity (in the present specification, exposure sensitivity represents a conversion degree from hydrophobicity to hydrophilicity per an exposure amount (ultraviolet ray irradiation amount)) include tetravalent organic groups having an aliphatic ring of formulae A-1 to A-25 or made of only an aliphatic group. Particularly, A-1, A-6, A-16 or A-19 are exemplified as highly effective organic groups.

In addition, tetravalent organic groups of formulae A-1 to A-25 is preferable from the viewpoint of the effect of enhancing an insulation property.

In the formula (1), when organic groups other than the formulae A-1 to A-25 are mixed in the organic groups represented by A, a ratio of the formulae A-1 to A-25 is preferably 10 mol % or more, more preferably 50 mol % or more, and most preferably 80 mol % or more.

In the formula (1), a bivalent organic group having a thiol ester bond represented by B is not particularly limited. However, preferable examples of the bivalent organic group structure include a structure of an aromatic ring such as a benzene ring bonded to the thiol ester group (the following formula (2)). It is considered that energy absorbed by the aromatic ring is effectively transferred to the thiol ester group in such a bivalent organic group. Consequently, it is presumed that the thiol ester group is decomposed, which leads to alter the hydrophilicity/hydrophobicity.

[Chemical Formula 5]

(2)

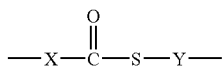

(where, X and Y independently represent an aromatic ring or an aliphatic ring, and these rings may be substituted by a halogen atom or an alkyl group having 1 to 4 carbon atoms).

Both of X and Y may be aromatic rings or one of them may be an aliphatic ring in the formula (2). When one of X and Y is an aliphatic ring, the improvement of insulation property can be expected.

Here, at least one of X or Y needs to be an aromatic ring for sufficiently absorbing an irradiated ultraviolet ray, when only tetravalent organic groups having aliphatic rings are used as the tetravalent organic group represented by A from the viewpoint of insulation property.

The specific structures of the aromatic ring in X and Y are shown in the following formulae (a) to (l). The formula (a) is particularly preferable from the viewpoint of an insulation property.

In addition, the specific structures of aliphatic rings are shown in the formulae (m) to (s).

TABLE 5

(Table 5 X and Y: aromatic rings)

(a)
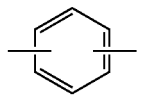

(b)
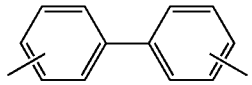

(c)

TABLE 5-continued
(Table 5 X and Y: aromatic rings)
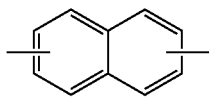
(d)
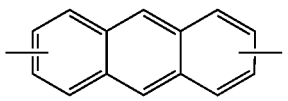
(e)
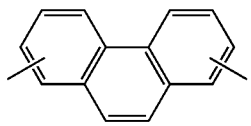
(f)
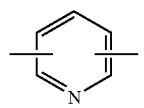
(g)
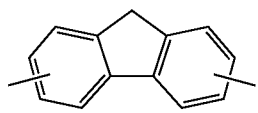
(h)
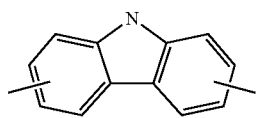
(i)
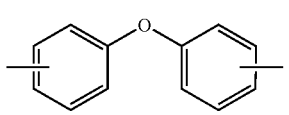
(j)
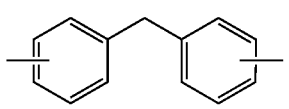
(k)
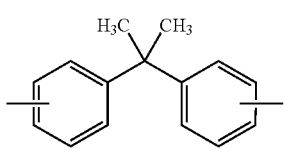
(l)
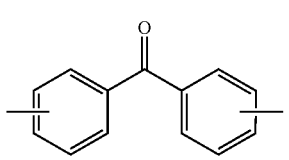
TABLE 6
(Table 6 X and Y: aliphatic rings)
  (m)
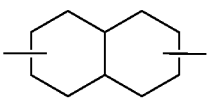  (n)
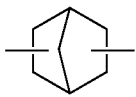  (o)
  (p)
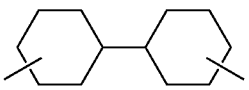  (q)
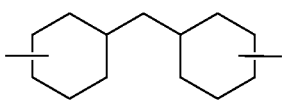  (r)
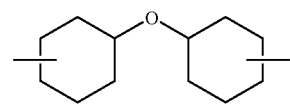  (s)
Preferable specific examples of the organic groups represented by B include organic groups of the following formulae B-1 to B-11.
TABLE 7
(Table 7 Formulae B-1 to B-11)
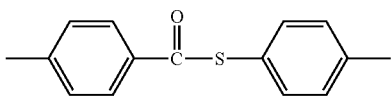  B-1
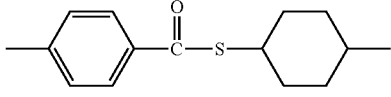  B-2
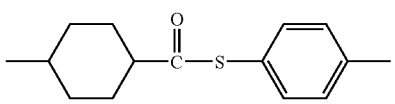  B-3
B-4

TABLE 7-continued (Table 7 Formulae B-1 to B-11)

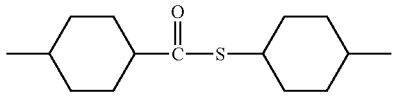
B-5

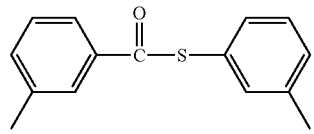 [SMILES: Cc1cccc(SC(=O)c2cccc(C)c2)c1]
B-6

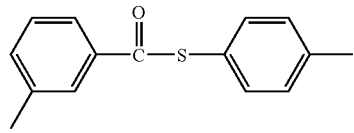
B-7

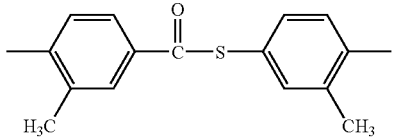
B-8

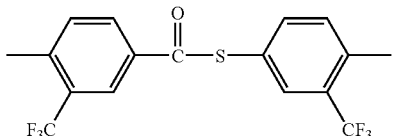
B-9

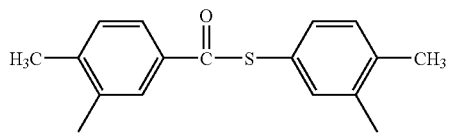
B-10

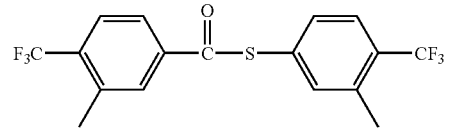
B-11

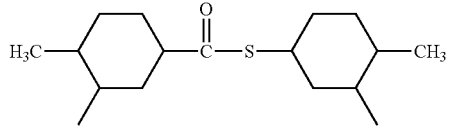

In the under layer film for image formation produced from the polyimide precursor or the polyimide of the present invention, the sensitivity of the under layer film to an ultraviolet ray is determined by the absorbing wavelength of the polyimide precursor or the polyimide and by the ease of decomposition by ultraviolet ray irradiation. Specifically, it is considered that the sensitivity increases in proportion to an amount of thiol ester groups (decomposition part) contained in the organic group represented by B in the formula (1). Accordingly, when focusing particularly on the point that the formed under layer film for image formation is highly sensitive, the most preferable ratio of the structure derived from the polyimide precursor (and the polyimide produced therefrom, as described below) represented by the formula (1) having a thiol ester bond in the under layer film for image formation is 100 mol %.

The under layer film for image formation may have a structure derived from the polyimide precursor (and the polyimide produced therefrom) represented by the following formula (5) in which the group B in the formula (1) is replaced with another bivalent organic group D having no thiol ester bond, in addition to the structure derived from the polyimide precursor (and the polyimide produced therefrom) represented by the formula (1), when other properties, for example, the improvement of an insulation property, solubility in a solvent, as well as hydrophobicity of the film are considered as important properties.

In this case, the bond between the structure of the formula (1) containing the bivalent organic group B having a thiol ester bond and the structure of the formula (5) containing another bivalent organic group having no thiol ester group may be any of a block bond and/or a random bond.

[Chemical Formula 6]

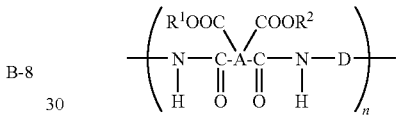
(5)

(where, A, $R^1$, $R^2$ and n are the same definition as defined in the formula (1), and D represents another bivalent organic group having no thiol ester bond).

The ratio of the formula (1) containing the bivalent organic group B having a thiol ester bond is preferably 30 mol % or more, because the sensitivity to an ultraviolet ray decreases when the content ratio of the formula (5) containing another bivalent organic group is too high. Moreover, the containing ratio of the formula (1) containing the bivalent organic group B having a thiol ester bond is required to be further increased, and the ratio is preferably 50 mol % or more in order to further increase the exposure sensitivity and reduce the irradiation time of an ultraviolet ray.

Organic groups having a high insulation property are preferable for the other bivalent organic group D having no thiol ester bond in the formula (5). Specific examples of the organic group D include the organic groups of the following formulae D-1 to D-57.

Among the following formulae D-1 to D57, the formulae D-1 to D-5 are exemplified in particular, as bivalent organic groups that are expected to improve an insulation property.

In addition, examples of bivalent organic groups having a significant effect of increasing solubility in a solvent include the formulae D-2, D-5, D-7, D-8, D-12, D-22, D-24 to D27, D-29 and the like.

Examples of bivalent organic groups that are expected to increase hydrophobicity of the surface of a cured film when the film is made include the formulae D-43 to D-57. The formulae D-55 to D-57, in which an alkyl group is added as a side chain, are exemplified as bivalent organic groups that are particularly effective.

TABLE 8
(Table 8 Formulae D-1 to D-5)
D-1
D-2
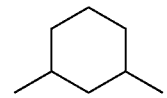
D-3
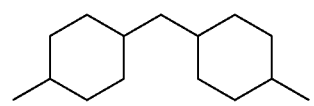
D-4
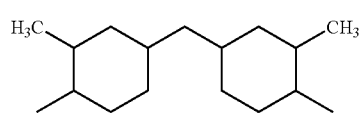
D-5
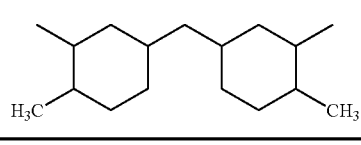
TABLE 9
(Table 9 Formulae D-6 to D-28)
D-6
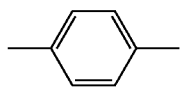
D-7
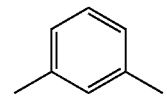
D-8
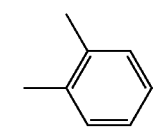
D-9
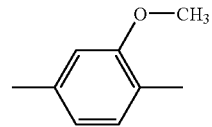
D-10
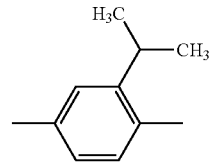
D-11
TABLE 9-continued
(Table 9 Formulae D-6 to D-28)
D-12
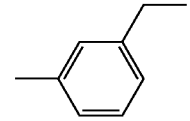
D-13
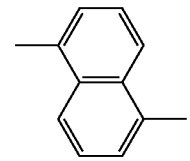
D-14
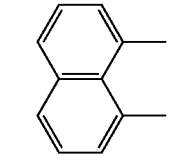
D-15
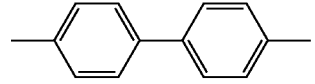
D-16
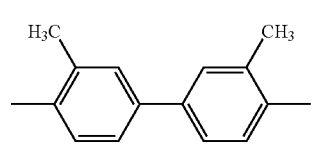
D-17
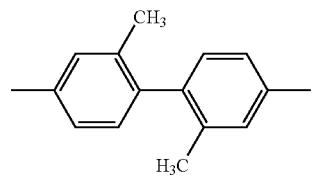
D-18
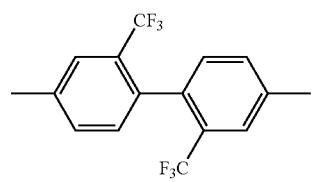
D-19
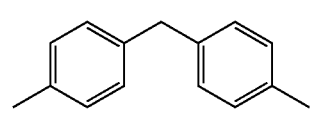
D-20
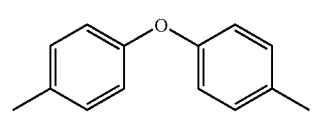

TABLE 9-continued
(Table 9 Formulae D-6 to D-28)
D-21
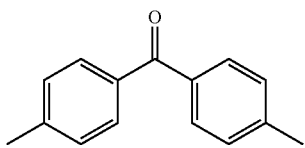
D-22
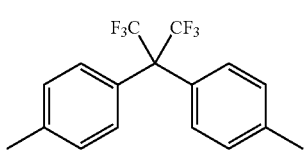
D-23
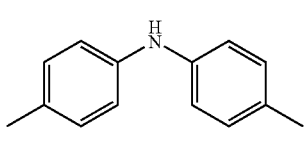
D-24
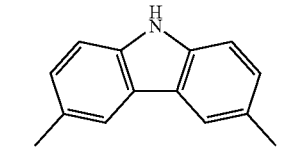
D-25
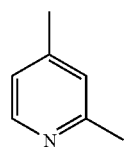
D-26
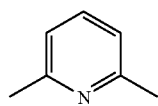
D-27
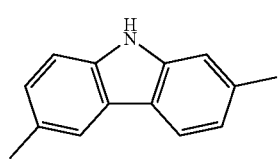
D-28
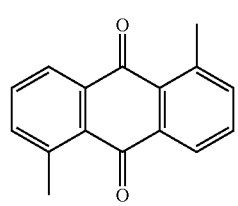 [SMILES: Cc1cccc2c1C(=O)c1cccc(C)c1C2=O]
TABLE 10
(Table 10 Formulae D-29 to D-42)
D-29
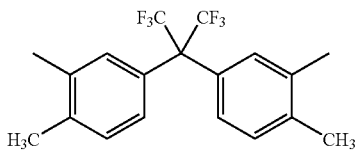
D-30
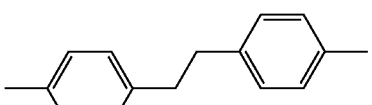
D-31
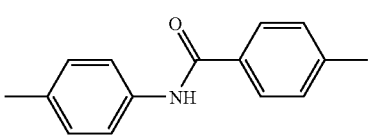
D-32
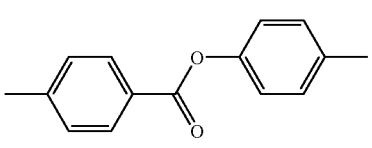
D-33
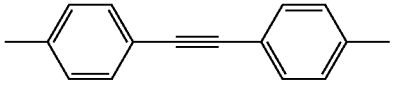
D-34
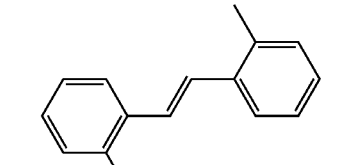
D-35
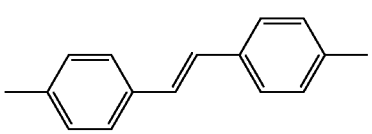
D-36
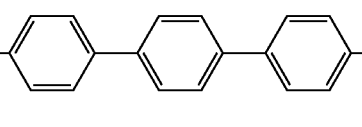
D-37
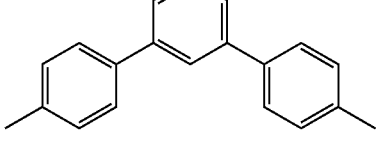
D-38
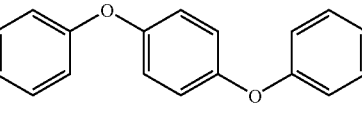

TABLE 10-continued (Table 10 Formulae D-29 to D-42)

D-39: [structure: 4-methylphenyl–O–(1,3-phenylene)–O–4-methylphenyl]

D-40: [structure: 4-methylphenyl–O–(4,4'-biphenylene)–O–4-methylphenyl]

D-41: [structure: bis(4-methylphenoxyphenyl)isopropylidene with two CH$_3$ groups]

D-42: [structure: bis(4-methylphenoxyphenyl)hexafluoroisopropylidene with two CF$_3$ groups]

TABLE 11

(Table 11 Formulae D-43 to D-57)

D-43: —(CH$_2$)$_n$—, n = 2 ~ 12

D-44: —(CH$_2$)$_2$—C(CH$_3$)$_2$—(CH$_2$)$_2$—

D-45: —CH$_2$—CH(CH$_3$)—(CH$_2$)$_2$—CH(CH$_3$)—(CH$_2$)$_2$—

D-46: —CH$_2$—CH(CH$_3$)—(CH$_2$)$_2$—CH(CH$_3$)—(CH$_2$)$_3$—

D-47: —(CH$_2$)$_4$—C(CH$_3$)$_2$—(CH$_2$)$_3$—

D-48: —(CH$_2$)$_2$—CH(CH$_3$)—(CH$_2$)$_5$—

D-49: —(CH$_2$)$_2$—CH(CH$_3$)—(CH$_2$)$_5$—

D-50: —(CH$_2$)$_3$—O—(CH$_2$)$_2$—(CH$_2$)$_3$—

D-51: [structure: 4-methylphenyl–(CH$_2$)$_n$–4-methylphenyl], n = 3 ~ 7

D-52: [structure: 4-methylphenyl–O–(CH$_2$)$_n$–O–4-methylphenyl], n = 2 ~ 12

D-53: [structure: 4-methylphenyl–O–CH$_2$–C(CH$_3$)$_2$–CH$_2$–O–4-methylphenyl]

D-54: [structure: 4-methylbenzoate–O–(CH$_2$)$_n$–O–4-methylbenzoate], n = 2 ~ 12

D-55: [structure: 2,4-dimethylphenyl–O–(CH$_2$)$_n$CH$_3$], n = 11 ~ 17

D-56: [structure: 2,4-dimethylphenyl–O–phenyl–cyclohexyl–(CH$_2$)$_n$CH$_3$], n = 4 ~ 6

D-57: [structure: 3,5-dimethylbenzoate–O–cyclohexyl–cyclohexyl–(CH$_2$)$_n$CH$_3$], n = 4 ~ 6

In the formula (1), each of $R^1$ and $R^2$ is a hydrogen atom or a univalent organic group. Examples of $R^1$ and $R^2$ include alkyl groups having 1 to 4 carbon atom(s).

Examples of the alkyl groups having 1 to 4 carbon atom(s) include a methyl group, ethyl group, propyl group, isopropyl group, butyl group, isobutyl group and t-butyl group.

The polyimide precursor according to the present invention is not particularly limited, as long as the precursor has each organic group described above. However, polyimide precursors (polyamic acids) represented by the following formula (6) is preferable because the polyimide precursor is relatively readily produced when a tetracarboxylic acid anhydride and a diamine are used as starting materials.

[Chemical Formula 7]

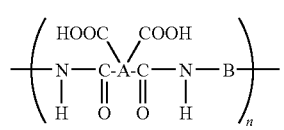

(6)

(where, A, B, $R^1$, $R^2$ and n are the same definition as defined in the formula (1)).

(Method for Manufacturing Polyimide Precursor)

The polyimide precursor according to the present invention is manufactured by polymerizing a tetracarboxylic acid dianhydride and derivatives thereof and dianime.

(Tetracarboxylic Acid Dianhydride and Derivatives Thereof)

Tetracarboxylic acid dianhydride and derivatives thereof are represented by a structure of the general formula (3) shown below, and A represents a tetravalent organic group. Specific examples of the tetravalent organic group include the formulae A-1 to A-46.

[Chemical Formula 8]

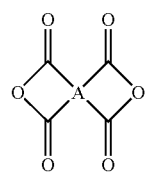

(3)

(where A is a tetravalent organic group, and B represents a bivalent organic group having a thiol ester bond in its main chain).

As described above, A is preferably the organic group having a large number of tetravalent organic groups containing an aliphatic ring, that is, a compound represented by the formula (3) having a higher ratio of an aliphatic acid anhydride.

This is because, an aliphatic acid anhydride has an excellent insulation property at high electrical field, although insulation property is remarkably decreased by applying high electrical field to a cured film when the polyimide precursor or the like is manufactured by using an aromatic acid anhydride and the cured film is produced from this polyimide precursor.

For example, since an operating voltage of an organic transistor may be about 1 MV/cm, an aliphatic acid anhydride is desirably used as a starting material for the polyimide precursor from the viewpoint of insulation property, when the polyimide precursor is used for this application.

(Diamine)

Diamine is represented by a structure of the general formula (4) shown below. B is a bivalent organic group having a thiol ester bond in its main chain, and specific examples of B include the organic groups shown in the above formulae B-1 to B-11.

[Chemical Formula 9]

$H_2N-B-NH_2$ (4)

In addition, diamines other than the diamine represented by the formula (4) can be used within the range which achieves the effect of the present invention. Specific examples of the diamine include diamines having a bivalent organic group represented by the formulae C-1 to C-57.

(Method for Manufacturing Polyimide Precursor)

A method of mixing a tetracarboxylic acid dianhydride component represented by the formula (3) and a diamine component represented by the formula (4) in an organic solvent is convenient for producing the polyimide precursor having repeating units represented by the formula (1).

Examples of the method of mixing a tetracarboxylic acid dianhydride component and a diamine component in an organic solvent include: a method of stirring a solution in which the diamine component is dispersed or dissolved in the organic solvent, and adding the tetracarboxylic acid dianhydride component as it is, or dispersed or dissolved in the organic solvent; or, in contrast, a method of adding the diamine component to a solution in which the tetracarboxylic acid dianhydride component is dispersed or dissolved in the organic solvent; or a method of alternately adding the tetracarboxylic acid dianhydride component and the diamine component.

Moreover, when compounds having a plurality of types of tetracarboxylic acid dianhydride components and diamine components are used, the plurality of types of components may be mixed and then polymerized, or may be individually polymerized in sequence.

When the polyimide precursor used in the present invention is manufactured from the tetracarboxylic acid dianhydride component represented by the formula (3) and the diamine represented by the formula (4), the blended ratio of both components, that is, (total number of moles of tetracarboxylic acid dianhydride component):(total number of moles of diamine component) is desirably from 1:0.5 to 1:1.5. As the molar ratio approaches 1:1, the degree of polymerization of the polyimide precursor produced increases, whereby the molecular weight increases, similarly to general polycondensation reactions.

In the method of manufacturing the polyimide precursor, a temperature at which the reaction of the tetracarboxylic acid dianhydride component and the diamine component in an organic solvent is effected is generally −20 to 150° C., preferably from 0 to 80° C.

The polymerization reaction rapidly proceeds to be completed, when the reaction temperature is set to high. However, the polyimide precursor having a high molecular weight may not be produced, when the reaction temperature is too high.

The solid content concentration of both components (the tetracarboxylic acid anhydride component and the diamine component) in a solvent is not particularly limited for the polymerization reaction in the organic solvent. However, when the concentration is too low, it is difficult to produce the polyimide precursor having a high molecular weight, and when the concentration is too high, homogeneous stirring becomes difficult because the viscosity of the reaction solution is too high. Therefore, preferable concentration is 1 to 50% by mass, and more preferably from 5 to 30% by mass. It is also possible that polymerization at an initial stage is performed at high concentration, and then the polymer (the polyimide precursor) is purified and then an organic solvent is added.

The organic solvent used in the polymerization reaction is not particularly limited, as long as the produced polyimide precursor is dissolved therein. However, specific examples of the organic solvent include dimethylformamide, N,N-dimethylformacetamide, N-methyl-2-pyrrolidone, N-methylcaprolactam, dimethylsulfoxide, tetramethylurea, pyridine, dimethylsulfone, hexamethylsulfoxide, and γ-butyrolactone. These solvents can be used singly or in combination of two or more thereof. Moreover, a solvent which dissolves no polyimide precursor may be added to the solvent within the range in which the produced polyimide precursor is not deposited.

The solution containing thus produced polyimide precursor can be used without modification to prepare a coating solution for an under layer film for image formation described below. In addition, the polyimide precursor can also be recovered and used by precipitating the polyimide precursor in a poor solvent such as water, methanol, or ethanol and isolating the precipitate.

(Polyimide)

The polyimide precursor having repeating units represented by the formulae (1) and (6) (and the formula (5)) can transform into a polyimide by dehydration and ring closure. A method for this imidization reaction is not particularly limited. However, catalyst imidization using a basic catalyst and an acid anhydride is preferable because the decrease in molecular weight in polyimide during the imidization reaction does not easily occur and the control of an imidization ratio is easy.

The catalyst imidization can be performed by stirring the polyimide precursor in the organic solution in the presence of a basic catalyst and an acid anhydride for 1 to 100 hour(s).

Here, the solution containing the polyimide precursor produced from the polymerization of the tetracarboxylic acid anhydride component and diamine component may be used without modification (without isolation).

Examples of the basic catalyst can include pyridine, triethylamine, trimethylamine, tributylamine, and trioctylamine. Among them, pyridine is preferable because pyridine has moderate basicity for the progress of the reaction.

Examples of the acid anhydride can include acetic acid anhydride, trimellitic acid anhydride, and pyromellitic acid anhydride. Among them, acetic acid anhydride is preferable because the produced polyimide is readily purified after the completion of imidization.

The solvent used in the polymerization reaction of the polyimide precursor can be used for the organic solvent.

The reaction temperature for the catalyst imidization is preferably from −20 to 250° C., and more preferably from 0 to 180° C. The imidization proceeds rapidly when a reaction temperature is set to high. However, the molecular weight of the polyimide may decrease, when the reaction temperature is too high.

The amount of the basic catalyst with respect to acid amide group in the polyimide precursor is preferably from 0.5 to 30 times by mole, and more preferably from 2 to 20 times by mole. Moreover, the amount of the acid anhydride with respect to acid amide group in the polyimide precursor is preferably from 1 to 50 times by mole, and more preferably from 3 to 30 times by mole.

The imidization ratio of the polyimide produced can be controlled by adjusting the reaction temperature and the amount of catalyst.

The reaction solution of the solvent soluble polyimide produced as described above can be used for producing a gate insulating film described below without modification. However, the polyimide after purification/recovery/washing is preferably used for film production, since the imidization catalyst and the like are contained in the reaction solution.

A method of precipitating the polyimide by feeding the reaction solution into a poor solvent with stirring and filtering the precipitate is convenient for the recovery of polyimide.

The poor solvent used for this process is not particularly limited. However, methanol, hexane, heptane, ethanol, toluene, water and the like can be exemplified. Washing is preferably performed using the poor solvent, after recovering the precipitate by filtration.

Polyimide powder can be made from the recovered polyimide by drying at ambient temperature or by heating under normal pressure or reduced pressure.

Impurity in the polymer can be further reduced by repeating the operation, in which this polymer powder is dissolved into a good solvent and the polyimide is reprecipitated by the poor solvent, for 2 to 10 times.

The good solvent used in this operation is not particularly limited, as long as the polyimide precursor or the polyimide can be dissolved. Examples of the good solvents include N,N-dimethylformamide, N,N-dimethylacetamide, 2-pyrrolidone, N-methyl-2-pyrrolidone, N-ethyl-2-pyrrolidone, N-vinyl-2-pyrrolidone, N-methylcaprolactam, dimethylsulfoxide, tetramethylurea, pyridine, and γ-butyrolactone.

In addition, the efficiency of purification is further improved when at least three types of poor solvents such as alcohols, ketones, and hydrocarbons are used for reprecipitation.

(Coating Solution for Under Layer Film for Image Formation)

A coating solution for an under layer film for image formation according to the present invention is a coating solution which contains the polyimide precursor and the polyimide according to the present invention as well as the solvent, and can further contain a coupling agent, a surfactant and the like described below, if desired.

The molecular weight of the polyimide precursor and/or the polyimide used for the coating solution for an under layer film for image formation according to the present invention is preferably a polystyrene conversion weight average molecular weight of 2,000 to 200,000 (measurement results measured by GPC), and more preferably 5,000 to 50,000, from the viewpoint of easy handling and stability of solvent resistance in film formation or the like.

The altering amount of hydrophilicity/hydrophobicity is not significantly different between the polyimide precursor and the polyimide, when a cured film is produced by using the coating solution for an under layer film for image formation according to the present invention and an ultraviolet ray is used to irradiate the film. Therefore, an imidization ratio is not particularly limited, when the cured film produced places emphasis on this point.

However, the polyimide is preferably used, because, by using the polyimide, a highly reliable film having low baking temperature (180° C. or less), at which a plastic substrate is usable, can be produced, and a high contact angle to water (high hydrophobicity) prior to ultraviolet ray irradiation can be obtained because polyimide has low polarity compared with the polyimide precursor.

On the contrary, the imidization ratio of the coating solution is preferably 90% or more, when the coating solution for an under layer film for image formation according to the present invention is used for a cured film (for example, a gate insulating film) which places emphasis on an insulation property. However, the imidization ratio can be reduced when solubility in a solvent is impaired. In this case, a high insulation property as an under layer film can be maintained by high imidization (high insulation property) of the lowermost layer using a blend technique as described below when the film is formed. Thus, the technique is useful.

The solvent used for the coating solution for an under layer film for image formation according to the present invention is not particularly limited, as long as the solvent can dissolve the polyimide precursor or the polyimide. Examples of the solvent include good solvents such as N,N-dimethylformamide, N,N-dimethylacetamide, 2-pyrrolidone, N-methyl-2-pyrrolidone, N-ethyl-2-pyrrolidone, N-vinyl-2-pyrrolidone, N-methylcaprolactam, dimethylsulfoxide, tetramethylurea, pyridine, and γ-butyrolactone. These solvents may be used singly or in combination. In addition, poor solvents such as alcohols, ketones, and hydrocarbons may be used by mixing with the good solvents.

The ratio of solid content in the coating solution for an under layer film for image formation according to the present invention is not particularly limited, as long as each component, including a coupling agent and the like as described below, is homogeneously dissolved in the solvent. However, for example, the ratio of solid content is 1 to 30% by mass or, for example, 5 to 20% by mass. Here, the solid content means the remains after the solvent is removed from the total components of the coating solution for an under layer film for image formation.

The method for preparing the coating solution for an under layer film for image formation according to the present invention is not particularly limited. However, a solution containing the polyimide precursor produced by polymerization of the tetracarboxylic acid anhydride component and diamine component or a reaction solution of polyimide produced by using the solution may be used without modification.

In addition, a coupling agent can be further included in the coating solution for an under layer film for image formation of the present invention in order to increase adhesion between the coating solution and a substrate, unless the coupling agent impairs the effect of the present invention.

Examples of the coupling agent include functional silane compounds and epoxy-containing compounds. Specific examples of the coupling agents can include compounds such as 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidepropyltrimethoxysilane, 3-ureidepropyltriethoxysilane, N-ethoxycarbonyl-3-aminopropyltrimethoxysilane, N-ethoxycarbonyl-3-aminopropyltriethoxysilane, N-trimethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonyl acetate, 9-trieethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, ethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerin diglycidyl ether, 2,2-dibromoneopentyl glycol diglycidyl ether, 6-tetradiglycidyl-2,4-hexanediol, N,N,N',N'-tetraglycidyl-m-xylenediamine, 1,3-bis(N,N-diglycidylaminomethyl)cyclohexane and N,N,N',N'-tetraglycidyl-4,4'-diaminodiphenylmethane.

These coupling agents may be used singly or in combination of two or more thereof.

When the coupling agent is used, its content is preferably from 0.1 to 30 parts by mass, and more preferably from 1 to 20 part(s) by mass based on 100 parts by mass of the coating solution for an under layer film for image formation.

Moreover, the coating solution for an under layer film for image formation of the present invention can contain a surfactant in order to improve coatability of the coating solution, and uniformity of film thickness and surface smoothness of the film produced from the coating solution.

The surfactant is not particularly limited. However, for example, fluorine-based surfactants, silicone-based surfactants, and nonion-based surfactants are included. Examples of these types of surfactants include Eftop EF301, EF303, EF352 (manufactured by JEMCO, Inc.), Megafac F171, F173, R-30 (manufactured by DIC Corporation), Fluorad FC430, FC431 (manufactured by Sumitomo 3M Limited), AsahiGuard AG710 and Surflon S-382, SC101, SC102, SC103, SC104, SC105, SC106 (manufactured by Asahi Glass Co., Ltd.).

When the surfactant is used, its content is preferably from 0.01 to 2 parts by mass, and more preferably from 0.01 to 1 part(s) by mass based on 100 parts by mass of the polymer component contained in the coating solution for an under layer film for image formation.

(Regarding Polymer Blend)

The coating solution for an under layer film for image formation according to the present invention can also take a form of what is called a polymer blend by mixing other polymers which can form a film (for example, a high insulation polymer) in addition to the polyimide precursor or the polyimide of the present invention.

In the polymer blend, by properly controlling the structure of contained polymers (the polyimide precursor and the polyimide according to the present invention and other polymers), the concentration gradient of each polymer in the thickness direction in the film can be generated when the cured film is formed. Thus, the technique can be used as a useful procedure.

For example, alteration of hydrophilicity/hydrophobicity has an influence only on the surface of the film. From the viewpoint of this, the polyimide precursor and/or the polyimide according to the present invention having thiol ester bonds may only exist in the upper layer (the surface layer) of the cured film.

Accordingly, when the coating solution for an under layer film for image formation is in the form of polymer blend (hereinafter, the coating solution in this form is referred to as a blended coating solution), the blended ratio of the polyimide precursor or the polyimide according to the present invention is 1% by mass to 100% by mass to the total mass of the blended coating solution. When the blended ratio is 1% by mass or less, image forming ability may deteriorate when the film is formed from the blended coating solution because it is difficult to completely cover the top surface of the film.

The polymer blend can be useful, for example, in the case of using the coating solution for an under layer film for image formation according to the present invention for the application of gate insulating film for which a high insulation property is particularly required.

Various properties such as applicability to a baking temperature of 180° C. or below, capability of film formation by application, solvent resistance to an organic semiconductor coating solution (non-polar solvents such as xylene and trimethyl benzene) and low moisture absorbance are required for the coating solution, when the solution is used for the application of a gate insulating film. Particularly, an insulation property is highly required. An imidization ratio for the coating solution for an under layer film for image formation according to the present invention may be required at least 80% or more, and 90% or more in some cases for achieving this high insulation property. On the contrary, solubility in a solvent is lost, when the imidization ratio exceeds 90%. In this case, by disposing the high insulation layer only as the lowermost layer of the insulation film and disposing a layer made from the coating solution for an under layer film for image formation according to the present invention as the upper layer, the high insulation property of the insulation film is retained and the problem of solubility is also resolved.

As described above, the high insulation layer as the lower layer of the cured film and the hydrophilicity/hydrophobicity altering layer as the upper layer can be produced by laminating these layers in order. However, this operation is cumbersome.

At this time, when the material for the high insulation layer and the material for the hydrophilicity/hydrophobicity altering layer (that is, the polyimide precursor and/or the polyimide according to the present invention) is mixed and the polarity or the molecular weight of the material for the upper layer is made to be low compared with the material for the lower layer, the above-described concentration gradient (means phase separation) can be readily controlled, because a material for the upper layer shows a behavior of migrating to the surface to form a layer during the evaporation of a solvent after the mixed solution is applied to the substrate and dried.

A soluble polyimide is the most preferable forming material for the high insulation film which can form the lower layer. When the soluble polyimide is used for the material for lower layer, the imidization ratio of the polyimide in the solution is desired to be high and is at least 50% or more, preferably 80% or more, and most preferably 90% or more from the viewpoint of insulation property.

Examples of other materials capable of being used for the lower layer material include general organic polymers such as epoxy resins, acryl resins, polypropylene, polyvinyl alcohol, polyvinyl phenol, polyisobutylene and polymethylmethacrylate.

The content ratio of the polyimide precursor and/or the polyimide according to the present invention in the polymer blend required to form the upper layer (the hydrophilicity/hydrophobicity altering layer) is theoretically about 1%, when the above-described polymer blend is used for, for example, an application of an organic transistor whose required film thickness is around 400 nm. However, the content of the polyimide precursor and/or the polyimide is preferably at least 5% or more, because excessively low content results in large variation of physical properties in the surface of the cured film.

(Method for Manufacturing Coating Film and Cured Film)

The coating solution for an under layer film for image formation of the present invention is applied to a glass substrate or a plastic substrate made of general-purpose polymers such as polypropylene, polyethylene, polycarbonate, polyethylene terephtalate, polyethersulfone, polyethylene naphtalate and polyimide by a dipping method, a spin-coating method, a transferring printing method, a roll coating method, an ink jet method, a spray method, a brush coating and the like. Then, the coating film can be formed by pre-drying by using a hot plate or an oven. Subsequently, a cured film capable of using as an under layer film for image formation or an insulation film is formed by subjecting this coating film to heat treatment.

The method of the heat treatment is not particularly limited. However, a method of heating under an appropriate atmosphere, that is, air, inert gas such as nitrogen, or under vacuum, using a hot plate or an oven can be exemplified.

The baking temperature is preferably from 180° C. to 250° C. from the viewpoint of accelerating thermal imidization of the polyimide precursor, and is preferably 180° C. or less from the viewpoint of the film formation on a plastic substrate.

The baking temperature may vary in more than two stages. The uniformity of the produced film can be further improved by stepwise baking.

Moreover, the coating solution for an under layer film for image formation can be used for applying onto a substrate without modification for forming the cured film because the coating solution is in the form of including the polyimide precursor and/or the polyimide and the above-described solvents. However, this solution may further include the solvents and other various solvents, and may be used as a coating solution in order to control the concentration, to ensure the coating film flatness, to improve the wettability of the coating solution to a substrate, to adjust the surface tension, polarity and boiling point of the coating solution, and so on.

Specific examples of such solvents include: ethyl cellosolve, butyl cellosolve, ethyl carbitol, butyl carbitol, ethyl carbitol acetate, ethylene glycol and the like; propylene glycol derivatives such as 1-methoxy-2-propanol, 1-ethoxy-2-propanol, 1-butoxy-2-propanol, 1-phenoxy-2-propanol, propylene glycol monoacetate, propylene glycol diacetate, propylene glycol-1-monomethyl ether-2-acetate, propylene glycol-1-monoethyl ether-2-acetate, dipropylene glycol, 2-(2-methoxypropoxy)propanol, 2-(2-ethoxypropoxy)propanol and 2-(2-butoxypropoxy)propanol; lactic acid derivatives such as methyl lactate, ethyl lactate, n-propyl lactate, n-butyl lactate, and isoamyl lactat, in addition to the solvents described earlier. These solvents may be used singly or in combination of two or more thereof.

From the viewpoint of the improvement of storage stability of the coating solution and thickness uniformity of the coating film, 20 to 80% by mass to the mass of the entire solvent is preferably at least one solvent selected from N,N-dimethylformamide, N,N-dimethylacetamide, N-methyl-2-pyrrolidone, γ-butyrolactone and dimethylsulfoxide.

The concentration of the coating solution is not particularly limited. However, the solid content concentration of the polyimide precursor and the polyimide is preferably from 0.1 to 30% by mass, and more preferably from 1 to 10% by mass. This concentration is appropriately determined depending on specifications of coating equipment and a desired film thickness.

When the cured film of the present invention produced as described above is used for an under layer film for image formation, if the film thickness is too thin, patternability after ultraviolet ray irradiation is degraded, and if too thick, the uniformity of the surface is impaired. Accordingly, the film thickness is preferably from 5 nm to 1000 nm, more preferably from 10 nm to 300 nm, and most preferably from 20 nm to 100 nm.

In addition, the cured film according to the present invention also functions as an insulation film when its insulation property is sufficiently high. In this case, the cured film is used as a gate insulating film directly disposed on a gate electrode, for example, of an organic FET device. On this occasion, the film thickness of the cured film is desirably thicker than that of the under layer film for image formation in order to ensure the insulation property. The film thickness is preferably from 20 nm to 1000 nm, more preferably from 50 nm to 800 nm, and most preferably from 100 nm to 500 nm.

[Method for Manufacturing Electrode for Image Formation]

An electrode for image formation can be manufactured by irradiating the under layer film for image formation according to the present invention with an ultraviolet ray in a patterned shape, and then applying an image formation solution as described below.

In the present invention, the method for irradiating the under layer film for image formation with an ultraviolet ray in a patterned shape is not particularly limited. However, for example, a method of irradiation through a mask in which an electrode pattern is drawn, a method of drawing an electrode pattern by using a laser beam and other methods can be included.

The material and shape of the mask is not particularly limited. This mask may be transparent to an ultraviolet ray in the region required for an electrode, and opaque to an ultraviolet ray in other region.

At this time, an ultraviolet ray having a wavelength in the range from 200 nm to 500 nm can be generally used. An appropriate wavelength is desirably selected through a filter and the like depending on the types of polyimide used. Specifically, the wavelengths of 248 nm, 254 nm, 303 nm, 313 nm, 365 nm and the like are included. Particularly, the wavelengths of 248 nm and 254 nm are preferred.

The surface energy of the under layer film for image formation according to the present invention gradually increases by ultraviolet ray irradiation and is saturated with the sufficient amount of irradiation. This increase of the surface energy brings a decrease of the contact angle of an image formation solution. As a result, the wettability of the image formation solution increases at a part that is irradiated with ultraviolet ray.

Accordingly, when the image formation solution is applied to the under layer film for image formation according to the present invention after ultraviolet ray irradiation, an electrode having any patterned shape can be produced as follows: the image formation solution forms a pattern in self-organization along a patterned shape drawn on the under layer film for image formation as difference of the surface energy.

Consequently, the required amount of ultraviolet ray irradiation to the under layer film for image formation is an irradiation amount which sufficiently alters the contact angle of the image formation solution. The irradiation amount is preferably 40 J/cm$^2$ or less, more preferably 30 J/cm$^2$ or less and most preferably 20 J/cm$^2$ or less from the viewpoint of energy efficiency and shortening the manufacturing process time.

In addition, the larger the difference of the contact angle of the image formation solution between the ultraviolet ray irradiation part and the ultraviolet ray non-irradiation part of the under layer film for image formation, the easier the patterning. Therefore, the electrode can be produced into complicated patterns and microscopic patterned shapes. Accordingly, the altered amount of the contact angle by ultraviolet ray irradiation is preferably 10° or more, more preferably 30° or more, and most preferably 50° or more.

Based on a similar reason, the contact angle of the image formation solution is preferably 50° or more at the ultraviolet ray non-irradiation part and 30° or less at the ultraviolet ray irradiation part.

At the present day, water is often used for the solvent of the image formation solution. Therefore, the performance evaluation of the under layer film can be performed by replacing the altered amount of the contact angle of the image formation solution with the altered amount of the contact angle of water in order to simplify the measurement.

The image formation solution according to the present invention is a coating solution which can be used as a functional film made by applying the solution to the substrate, and then evaporating the solvent contained in the image formation solution. For example, a solution in which a charge transport material is dissolved or homogeneously dispersed in at least one type of solvents is included. Here, a charge transport property has the same definition as conductivity, and means any one of a hole transport property, an electron transport property, and a charge transport property of both of holes and electrons.

The charge transport material is not particularly limited, as long as it has conductivity capable of transporting holes or electrons. Examples of the charge transport material include metal fine particles of gold, silver, copper, aluminum, and the like; inorganic materials such as carbon blacks, fullerenes and carbon nano tubes; and organic π-conjugated polymers such as polythiophene, polyaniline, polypyrrole, polyfluorene and derivatives thereof.

In addition, charge receiving materials such as halogens, Lewis acids, protonic acids and transition metal compounds (specific examples including $Br_2$, $I_2$, $Cl_2$, $FeCl_3$, $MoCl_5$, $BF_3$, $AsF_5$, $SO_3$, $HNO_3$, $H_2SO_4$, and polystyrene sulfonic acid) or charge donating materials such as alkali metals and alkyl ammonium ions (specific examples including Li, Na, K, Cs, tetraethylene ammonium, and tetrabutyl ammonium) may further be added to the image formation solution as dopants in order to improve the charge transport property of the charge transport material.

The solvent for the image formation solution is not particularly limited, as long as the charge transport material or the dopants can be dissolved or homogeneously dispersed in the solvent. However, water and various alcohols are preferable from the viewpoint of producing precise electrode pattern, since it is preferable that a sufficiently large contact angle is provided to the ultraviolet ray non-irradiation part of the under layer film for image formation and less damage is given to the under layer film for image formation according to the present invention.

In addition, polar solvents such as N,N-dimethylformamide, N,N-dimethylacetamide, 2-pyrrolidone, N-methyl-2-pyrrolidone, N-ethyl-2-pyrrolidone, N-vinyl-2-pyrrolidone, N-methylcaprolactam, dimethylsulfoxide and tetramethylurea are also preferable from the viewpoint of having excellent solubility of the organic based charge transporting material, and providing a sufficiently large contact angle to the ultraviolet ray non-irradiation part of the under layer film for image formation of the present invention. However, these solvents are preferably used in a range in which the under layer film for image formation according to the present invention is less damaged.

The concentration of the charge transporting material in the image formation solution is preferably from 0.01 to 30% by mass, more preferably from 0.1 to 10% by mass, and most preferably from 1 to 5% by mass.

Specific examples of the image formation solution according to the present invention include Baytron (registered trademark) P (polyethylenedioxythiophene, manufactured by Bayer AG).

An electrode according to the present invention is produced by applying the image formation solution on the under layer film for image formation according to the present invention and evaporating the solvent after pattern formation. The method of evaporating the solvent is not particularly limited.

However, evaporating the solvent under an appropriate atmosphere, that is, air, inert gas such as nitrogen, or under vacuum using a hot plate or an oven, can produce the uniform surface of the formed film.

The temperature for evaporating the solvent is not particularly limited. However, evaporation is preferably performed at 40 to 250° C. The evaporation temperature may vary in more than two stages from the viewpoint of achieving the retention of patterned shape and the uniformity of film thickness.

The electrode made from this image formation solution is used for electrodes of electronic devices such as field-effect transistors, bipolar transistors, various diodes and various sensors, as well as wirings for connecting electronic devices.

The electronic device according to the present invention has the electrode according to the present invention.

An example of the under layer film for image formation of the present invention used for an organic FET element will be described. However, the present invention is not limited to this example.

First, a high doping n-type silicon substrate is prepared. It is preferable that the substrate is cleaned in advance by liquid washing with a detergent, an alcohol, purified water or the like, and surface treatment such as ozone treatment and oxygen-plasma treatment is preferably performed just before its use. A film of $SiO_2$, $Ta_2O_5$, $Al_2O_3$ or the like is formed on a substrate by methods such as thermal oxidation, sputtering, CVD or vapor deposition to form a gate insulating film. The film thickness of the gate insulation layer is preferably from 30 nm to 1000 nm based on the relationship between drive voltage and electrical insulation property, although it depends on the applications of the organic FET.

Next, a layer containing the polyimide precursor and/or the polyimide having repeating units represented by the formula (1) is formed in accordance with the above-descried procedures on the insulating film. The film thickness of the layer is most preferably from 20 nm to 100 nm. Subsequently, an ultraviolet ray is radiated in a patterned shape through a mask or the like.

Subsequently, an image formation solution using a polar solvent such as water is applied to the surface of the under layer film for image formation. The applied image formation solution rapidly spreads to a hydrophilic part (an ultraviolet ray irradiation part) while being repelled by a hydrophobic part (an ultraviolet ray non-irradiation part), and is then stabilized. By drying the stabilized solution, a patterned source and drain electrodes are formed. The coating method for the image formation solution is not particularly limited. However, an ink jet printing method or spray coating method is preferable due to the ease of liquid volume control.

Finally, the formation of the organic FET is completed by forming a film of an organic semiconductor material such as pentacene and polytiophene, which is an active layer of the organic FET. The method of film formation of the organic semiconductor material is not particularly limited. However, vacuum deposition, as well as a spin-coating method, a casting method, an inkjet method, a spray method and other methods using the solution may be included.

The organic FET manufactured as described above can remarkably reduce the manufacturing processes. Moreover, large current can be extracted in the case of using an organic semiconductor material having low mobility as an active layer, because an organic FET having a shorter channel than the channel made by mask vapor deposition method can be manufactured. In addition, the under layer film for image formation produced by the method according to the present invention can also be used as a gate insulation layer, because the film has an excellent electric insulation property. Thus, the manufacturing process can further be simplified.

EXAMPLES

The present invention will be described further in detail hereinafter with reference to examples. However, the present invention is not limited to these examples.

(Measurement of Number Average Molecular Weight and Weight Average Molecular Weight)

The number average molecular weight (hereinafter referred to as Mn) and the weight average molecular weight (hereinafter referred to as Mw) of the polyimide precursors produced according to the following Synthesis Examples are measured by GPC (ambient temperature gel permeation chromatography) with the following equipment and measurement conditions, and calculated as polyethylene glycol (or polyethylene oxide) conversion value.

GPC equipment: Shodex (registered trademark) (GPC-101), manufactured by Showa Denko K.K Column: Shodex (registered trademark) (serial connection of KD803 and KD805), manufactured by Shown Denko K.K Column temperature: 50° C.

Eluent: N,N-dimethylformamide (lithium bromide hydrate ($LiBr.H_2O$) 30 mmol/L, phosphoric acid anhydrous crystal (o-phosphoric acid) 30 mmol/L and tetrahydrofuran (THF) 10 ml/L, as additives)

Flow rate: 1.0 ml/min

Standard sample for preparing calibration curve:

TSK standard polyethylene oxide (molecular weight: about 900,000, 150,000, 100,000 and 30,000), manufactured by Tosoh Corporation Polyethylene glycol (molecular weight: about 12,000, 4,000 and 1,000), manufactured by Polymer Laboratories Ltd.

(Measurement of Film Thickness)

The film thickness of a polyimide film was determined by measuring a level difference prepared by peeling a part of the polyimide films using a retractable knife, using a fully automatic microfigure measuring instrument (ET4000A, manufactured by Kosaka Laboratory Ltd.) at a measuring force of 10 μN and a sweeping speed of 0.05 mm/sec.

Synthesis Example 1

Polymerization of Polyimide Precursor (PI-1)

Under nitrogen stream, 2.4431 g (0.01 mol) of 4-amino-S-thiobenzoic acid-4'-aminophenyl (hereinafter referred to as DA-25) was fed into a 50 ml four-neck flask and dissolved into 24.62 g of N-methyl-2-pyrrolidone (hereinafter, NMP). Subsequently, 1.955 g (0.01 mol) of 1,2,3,4-cyclobutanetetracarboxylic acid anhydride (hereinafter, CBDA) was added and the mixture was stirred for 10 hours at 23° C. to perform a polymerization reaction. Furthermore, this mixture was diluted with NMP to obtain 6% by weight solution of the polyimide precursor (PI-1).

The number average molecular weight (Mn) and weight average molecular weight (Mw) of the produced polyimide precursor (PI-1) were Mn=17,700 and Mw=38,300, respectively.

Synthesis Example 2

Polymerization of Polyimide Precursor (PI-2)

Under nitrogen stream, 1.466 g (0.006 mol) of DA-25 was fed into a 50 ml four-neck flask and dissolved into 18.313 g of NMP. Subsequently, 1.772 g (0.006 mol) of 3,4-dicarboxy-1, 2,3,4-tetrahydro-1-naphthalene succinic acid anhydride (hereinafter, TDA) was added and the mixture was stirred for 24 hours at 50° C. to perform a polymerization reaction. Furthermore, this mixture was diluted with NMP to obtain 6% by weight solution of the polyimide precursor (PI-2).

The number average molecular weight (Mn) and weight average molecular weight (Mw) of the produced polyimide precursor (PI-2) were Mn=5,200 and Mw=7,900, respectively.

Synthesis Example 3

Polymerization of Polyimide Precursor (PI-3)

Under nitrogen stream, 1.466 g (0.006 mol) of DA-25 was fed into a 50 ml four-neck flask and dissolved into 16.644 g of NMP. Subsequently, 1.486 g (0.006 mol) of bicyclo(3,3,0)-octane-2,4,6,8-tetracarboxylic acid anhydride (hereinafter, BODA) was added and the mixture was stirred for 24 hours at 80° C. to perform a polymerization reaction. Furthermore, this mixture was diluted with NMP to obtain 6% by weight solution of the polyimide precursor (PI-3).

The number average molecular weight (Mn) and weight average molecular weight (Mw) of the produced polyimide precursor (PI-3) were Mn=4,900 and Mw=7,200, respectively.

Synthesis Example 4

Polymerization of Polyimide Precursor (PI-4)

Under nitrogen stream, 1.466 g (0.006 mol) of DA-25 was fed into a 50 ml four-neck flask and dissolved into 15.50 g of NMP. Subsequently, 1.269 g (0.006 mol) of pyromellitic acid dianhydride (hereinafter, PMDA) was added and the mixture was stirred for 6 hours at 24° C. to perform a polymerization reaction. Furthermore, this mixture was diluted with NMP to obtain 6% by weight solution of the polyimide precursor (PI-4).

The number average molecular weight (Mn) and weight average molecular weight (Mw) of the produced polyimide precursor (PI-4) were Mn=16,100 and Mw=33,500, respectively.

Synthesis Example 5

Polymerization of Polyimide Precursor (PI-5)

Under nitrogen stream, 8.01 g (0.040 mol) of 4,4'-diaminodiphenylether (hereinafter, DDE) was fed into a 200 ml four-neck flask and dissolved into 87.6 g of NMP. Subsequently, 7.45 g (0.038 mol) of CBDA was added and the mixture was stirred for 5 hours at 23° C. to perform a polymerization reaction. Furthermore, this mixture was diluted with NMP to obtain 6% by weight solution of the polyimide precursor (PI-5).

The number average molecular weight (Mn) and weight average molecular weight (Mw) of the produced polyimide precursor (PI-5) were Mn=14,000 and Mw=32,600, respectively.

Synthesis Example 6

Polymerization of Polyimide Precursor (PI-6)

Under nitrogen stream, 8.01 g (0.040 mol) of DDE was fed into a 200 ml four-neck flask and dissolved into 91.9 g of NMP. Subsequently, 8.20 g (0.038 mol) of PMDA was added and the mixture was stirred for 2 hours at 23° C. to perform a polymerization reaction. Furthermore, this mixture was diluted with NMP to obtain 6% by weight solution of the polyimide precursor (PI-6).

The number average molecular weight (Mn) and weight average molecular weight (Mw) of the produced polyimide precursor (PI-6) were Mn=11,500 and Mw=25,200, respectively.

Tetracarboxylic acid anhydrides and diamines, and compounds thereof used in Synthesys Examples are shown below.

TABLE 12

|  | Tetracarboxylic acid anhydride | | | | Diamine | | Molecular weight of PI | |
|---|---|---|---|---|---|---|---|---|
|  | CBDA | TDA | BODA | PMDA | DA-25 | DDE | Mn | Mw |
| PI-1 | ○ |  |  |  | ○ |  | 17,000 | 38,300 |
| PI-2 |  | ○ |  |  | ○ |  | 5,200 | 7,900 |
| PI-3 |  |  | ○ |  | ○ |  | 4,900 | 7,200 |
| PI-4 |  |  |  | ○ | ○ |  | 16,100 | 33,500 |
| PI-5 | ○ |  |  |  |  | ○ | 14,000 | 32,600 |
| PI-6 |  |  |  | ○ |  | ○ | 11,500 | 25,200 |

[Chemical Formula 10]

(Tetracarboxylic acid anhydrides used in the present example)

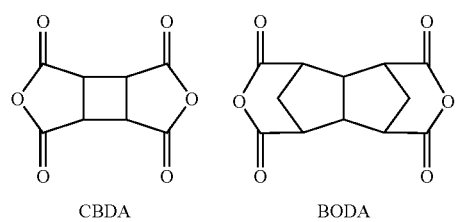

CBDA                BODA

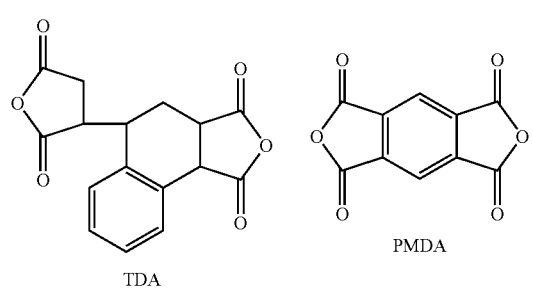

TDA                PMDA

-continued

[Chemical Formula 11]

(Diamines used in the present example)

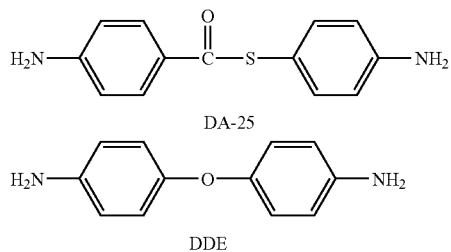

DA-25

DDE

Example 1

Ultraviolet Ray Sensitivity Characteristics of Polyimide Cured Film Formed from PI-1

The solution of PI-1 prepared in Synthesis Example 1 was dropped by using a syringe equipped with a filter having 0.2 μm pores, and applied to an ITO-deposited glass substrate (2.5 cm squire, thickness 0.7 mm) by the spin coating method. Subsequently, the coating was subjected to heat treatment on a hot plate of 80° C. for 5 minutes, and the organic solvent was evaporated. Then, the coating was baked on the hot plate of 230° C. for 60 minutes to produce a polyimide film having a film thickness of about 200 nm. The contact angle to water of this polyimide film was measured.

The surface of the polyimide film produced by a similar procedure was irradiated with ultraviolet rays in irradiation amount of 20 J/cm$^2$ or 30 J/cm$^2$. The contact angle to water of each irradiated film was measured.

The measurement result of the contact angle to water is shown in Table 13.

Example 2

Ultraviolet Ray Sensitivity Characteristics of Polyimide Cured Film Formed from PI-2

A polyimide film was prepared by using a similar method in Example 1 using the solution of PI-2 prepared in Synthesis Example 2. The contact angles to water of the ultraviolet ray non-irradiation film and the films after irradiation of 20 J/cm$^2$ or 30 J/cm$^2$ were measured.

The measurement result of the contact angle to water is shown in Table 13.

Example 3

Ultraviolet Ray Sensitivity Characteristics of Polyimide Cured Film Formed from PI-3

The polyimide film was prepared by using a similar method in Example 1 using the solution of PI-3 prepared in Synthesis Example 3. The contact angles to water of the ultraviolet ray non-irradiation film and the films after irradiation of 20 J/cm$^2$ or 30 J/cm$^2$ were measured.

The measurement result of the contact angle to water is shown in Table 13.

Example 4

Ultraviolet Ray Sensitivity Characteristics of Polyimide Cured Film Formed from PI-4

The polyimide film was prepared by using a similar method in Example 1 using the solution of PI-4 prepared in Synthesis Example 4. The contact angles to water of the ultraviolet ray non-irradiation film and the films after irradiation of 20 J/cm$^2$ or 30 J/cm$^2$ were measured.

The measurement result of the contact angle to water is shown in Table 13.

Comparative Example 1

Ultraviolet Ray Sensitivity Characteristics of Polyimide Cured Film Formed from PI-5

The polyimide film was prepared by using a similar method in Example 1 using the solution of PI-5 prepared in Synthesis Example 5. The contact angles to water of the ultraviolet ray non-irradiation film and the films after irradiation of 20 J/cm$^2$ or 30 J/cm$^2$ were measured.

The measurement result of the contact angle to water is shown in Table 13.

Comparative Example 2

Ultraviolet Ray Sensitivity Characteristics of Polyimide Cured Film Formed from PI-6

The polyimide film was prepared by using a similar method in Example 1 using the solution of PI-6 prepared in Synthesis Example 6. The contact angles to water of the ultraviolet ray non-irradiation film and the films after irradiation of 20 J/cm$^2$ or 30 J/cm$^2$ were measured.

The measurement result of the contact angle to water is shown in Table 13.

TABLE 13

| | Ultraviolet ray irradiation amount and contact angle to water | | | |
|---|---|---|---|---|
| No. | Used PI | Non-irradiation | 20 J/cm$^2$ | 30 J/cm$^2$ |
| Example 1 | PI-1 | 64° | 6° | 6° |
| Example 2 | PI-2 | 63° | 10° | 6° |
| Example 3 | PI-3 | 53° | 16° | 6° |
| Example 4 | PI-4 | 58° | 30° | 30° |
| Comparative Example 1 | PI-5 | 62° | 42° | 20° |
| Comparative Example 2 | PI-6 | 69° | 65° | 63° |

As shown in Table 13, Examples 1 to 4 corresponding to the cured films produced from the polyimide precursor or the polyimide according to the present invention showed significant change of the contact angle to water even in low exposure amount (20 J/cm$^2$) compared with Comparative Examples 1 and 2 corresponding to related-art materials.

INDUSTRIAL APPLICABILITY

The polyimide precursor and the polyimide according to the present invention can shorten the exposure time required for altering hydrophilicity/hydrophobicity. Therefore, it can be expected that the manufacturing cost in the patterning layer formation of a functional material, such as an electrode is reduced.

In addition, it is possible to impart anisotropy to the film produced from the polyimide precursor and the polyimide according to the present invention by polarized ultraviolet (UV) irradiation. This means that the film can be used as an orientation treatment film for functional materials such as liquid crystals and semiconductors. Therefore, it is expected that the manufacturing time can be shortened similarly to the case of using the film as a base film for image formation.

The invention claimed is:

1. A polyimide precursor having a linear structure represented by the following formula (1):

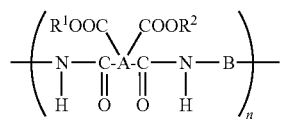  (1)

where A represents a tetravalent organic group;

R$^1$ and R$^2$ independently represent a hydrogen atom or a univalent organic group;

n represents a natural number; and

B represents a bivalent organic group represented by the following formula (2):

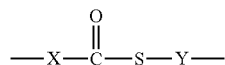  (2)

where X and Y independently represent an aromatic ring or an aliphatic ring, and these rings are optionally substituted by a halogen atom or an alkyl group having 1 to 4 carbon atom(s), wherein the tetravalent organic group has a formula selected from the group consisting of Formulae A-1 through A-25 and A-37 through A-46:

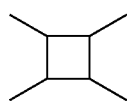 A-1

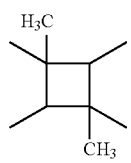 A-2

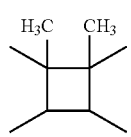 A-3

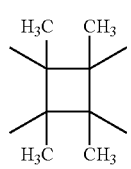 A-4

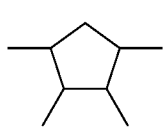 A-5

-continued

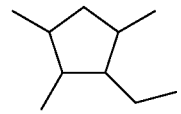 A-6

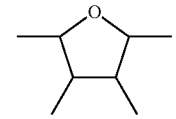 A-7

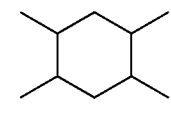 A-8

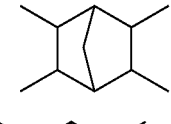 A-9

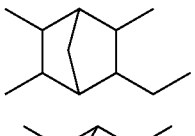 A-10

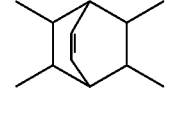 A-11

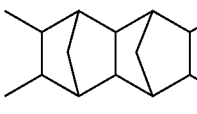 A-12

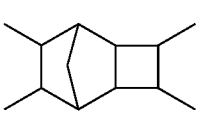 A-13

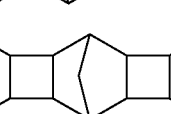 A-14

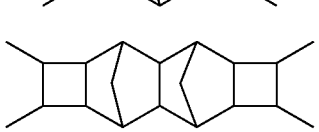 A-15

 A-16

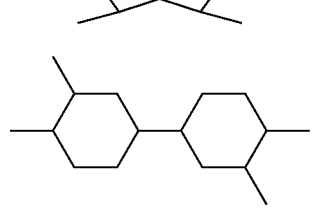 A-17

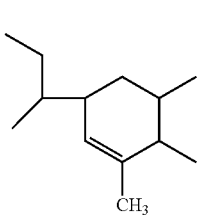 A-18

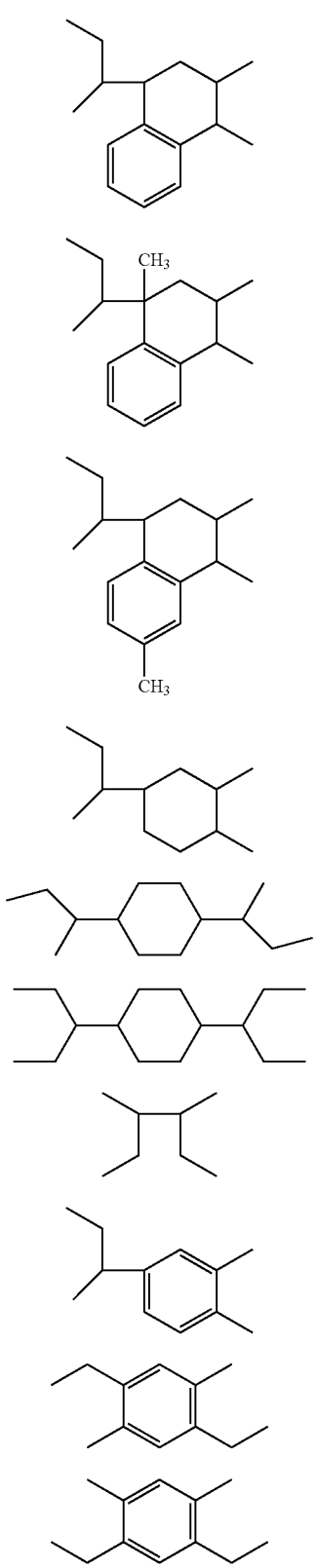

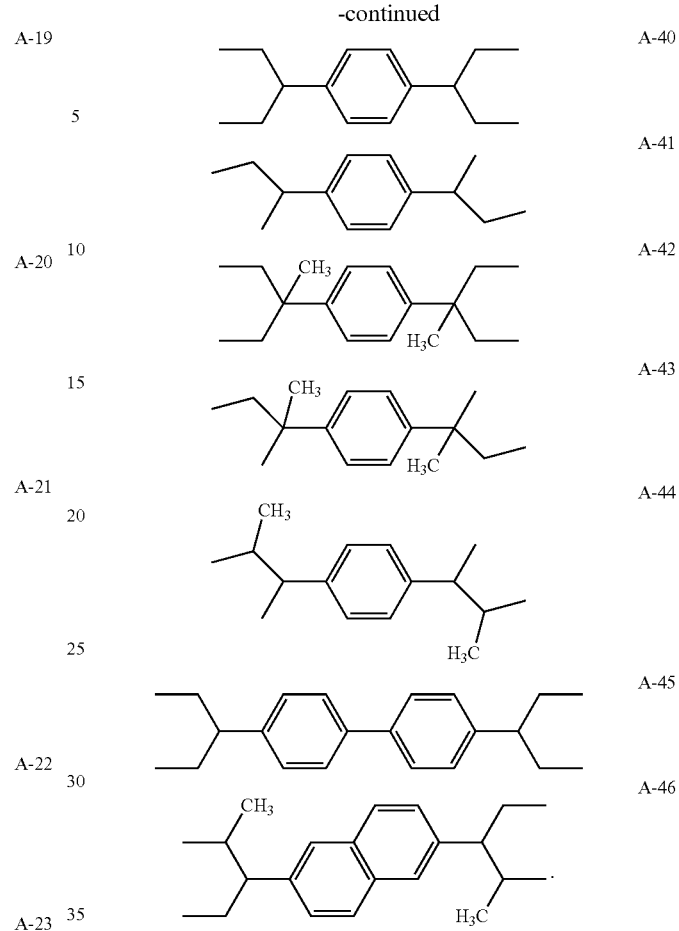

2. The polyimide precursor according to claim 1, wherein the polyimide precursor is produced by polymerizing at least one type of tetracarboxylic acid dianhydride represented by the following formula (3) and a derivative thereof with at least one type of a diamine represented by the following formula (4):

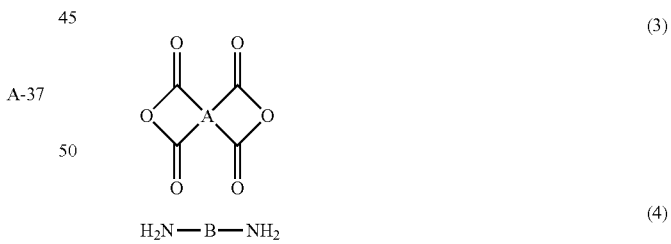

where B represents a bivalent organic group represented by formula (2).

3. A polyimide produced by dehydrating and ring closing the polyimide precursor as claimed in claim 1.

4. The polyimide precursor of claim 1, wherein the tetravalent organic group has a formula selected from the group consisting of Formulae A-37, A-39, and A-42 through A-46.

* * * * *